United States Patent
Struye et al.

(10) Patent No.: US 6,642,650 B1
(45) Date of Patent: Nov. 4, 2003

(54) REFUSABLE PERSONAL MONITORING DEVICE

(75) Inventors: Luc Struye, Mortsel (BE); Paul Leblans, Kontich (BE); Peter Willems, Stekene (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/427,027

(22) Filed: Oct. 26, 1999

Related U.S. Application Data

(60) Provisional application No. 60/119,069, filed on Feb. 8, 1999.

(30) Foreign Application Priority Data

Nov. 10, 1998 (EP) .............................................. 98203794

(51) Int. Cl.$^7$ ................................................ H05B 33/00
(52) U.S. Cl. ..................... 313/502; 313/483; 315/169.3
(58) Field of Search ................................ 313/502, 503, 313/505, 506, 507, 483; 428/917, 690; 315/169.3

(56) References Cited

U.S. PATENT DOCUMENTS

| | | | |
|---|---|---|---|
| 4,873,441 A | * 10/1989 | Kimura et al. | 250/588 |
| 5,314,759 A | 5/1994 | Harkonen et al. | |
| 5,670,839 A | 9/1997 | Noma et al. | |
| 5,818,065 A | * 10/1998 | Exelmans | 250/488 |

FOREIGN PATENT DOCUMENTS

| | | | | |
|---|---|---|---|---|
| EP | 0846962 A1 | * 12/1996 | | G01T/1/29 |
| EP | 0 844 497 A2 | 5/1998 | | |
| EP | 0 892 283 A1 | 1/1999 | | |
| JP | 07-122366 | * 5/1995 | | H05B/33/14 |

OTHER PUBLICATIONS

Patent Abstracts of Japan, vol. 095, No. 008, Sep. 29, 1995 and JP 07 122366 A (Oki Electric Ind. Co. Ltd.), May 12, 1995.

* cited by examiner

Primary Examiner—Vip Patel
Assistant Examiner—Joseph Williams
(74) Attorney, Agent, or Firm—Breiner & Breiner, L.L.C.

(57) ABSTRACT

A device in form of a practical and reusable card for personal monitoring of incident penetrating radiation energy and for reading said energy comprising a stimulable phosphor absorbing and storing said energy and being stimulable with a wavelength $\lambda_a$; an electroluminescent phosphor emitting, upon application of an electrical field, stimulation light with wavelength $\lambda_a$, said wavelength $\lambda_a$ being different from the said incident penetrating radiation, and wherein said device is equipped with means in order to apply an electrical field on said electroluminescent phosphor and wherein said stimulable phosphor and said electroluminescent phosphor are positioned relative to each other so that said light emitted by said electroluminescent phosphor reaches said stimulable phosphor for stimulating said phosphor in order to release stimulated light.

26 Claims, 3 Drawing Sheets

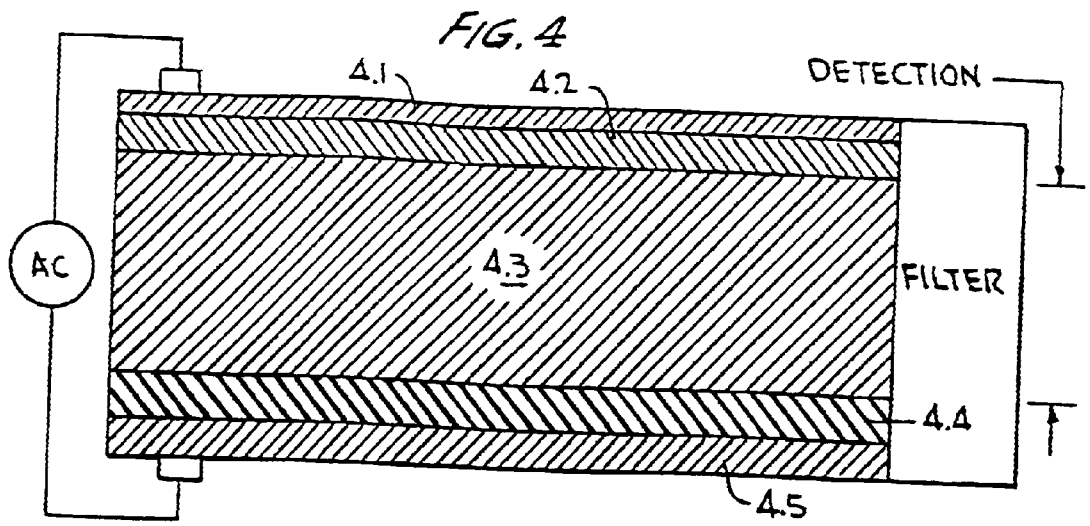
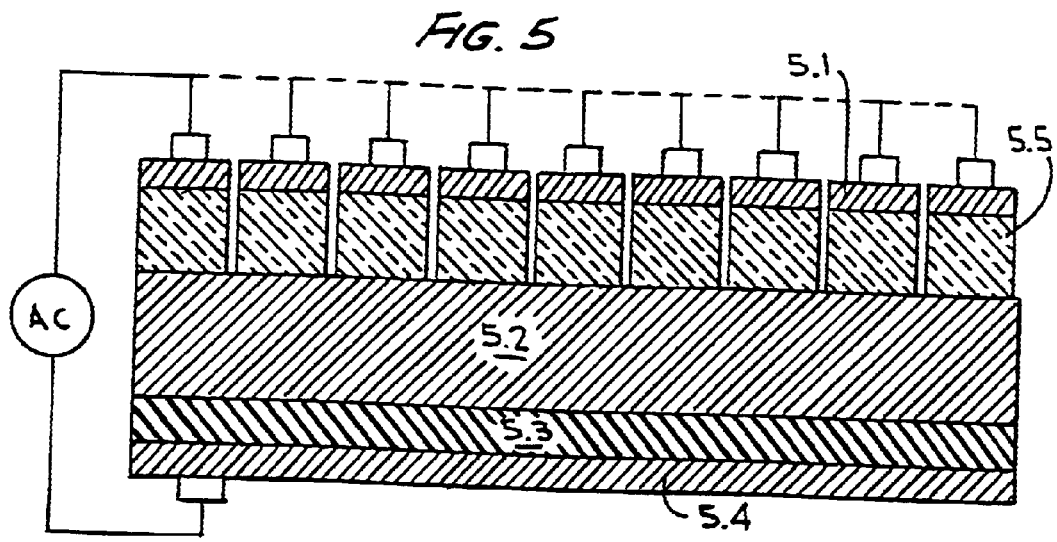
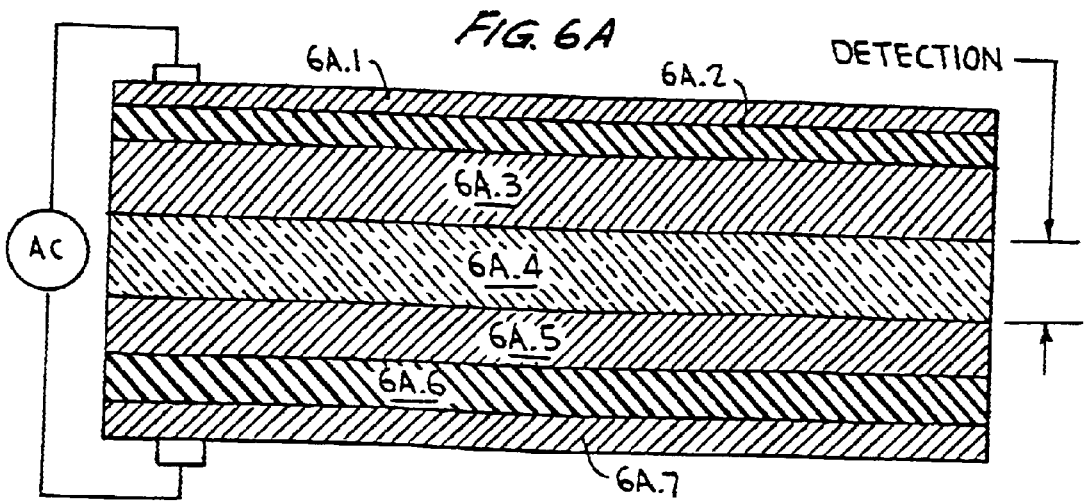

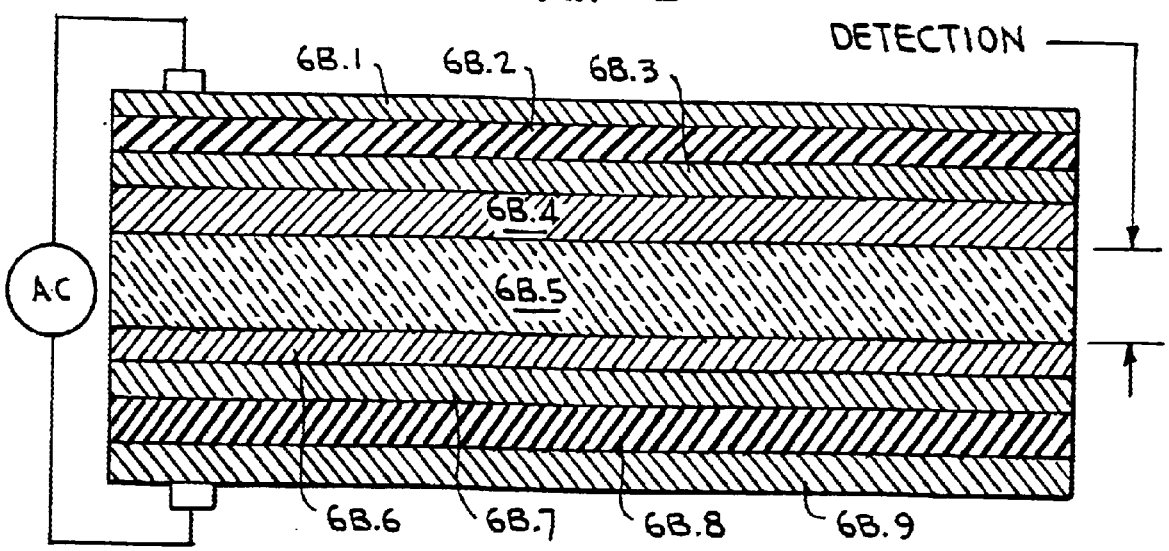
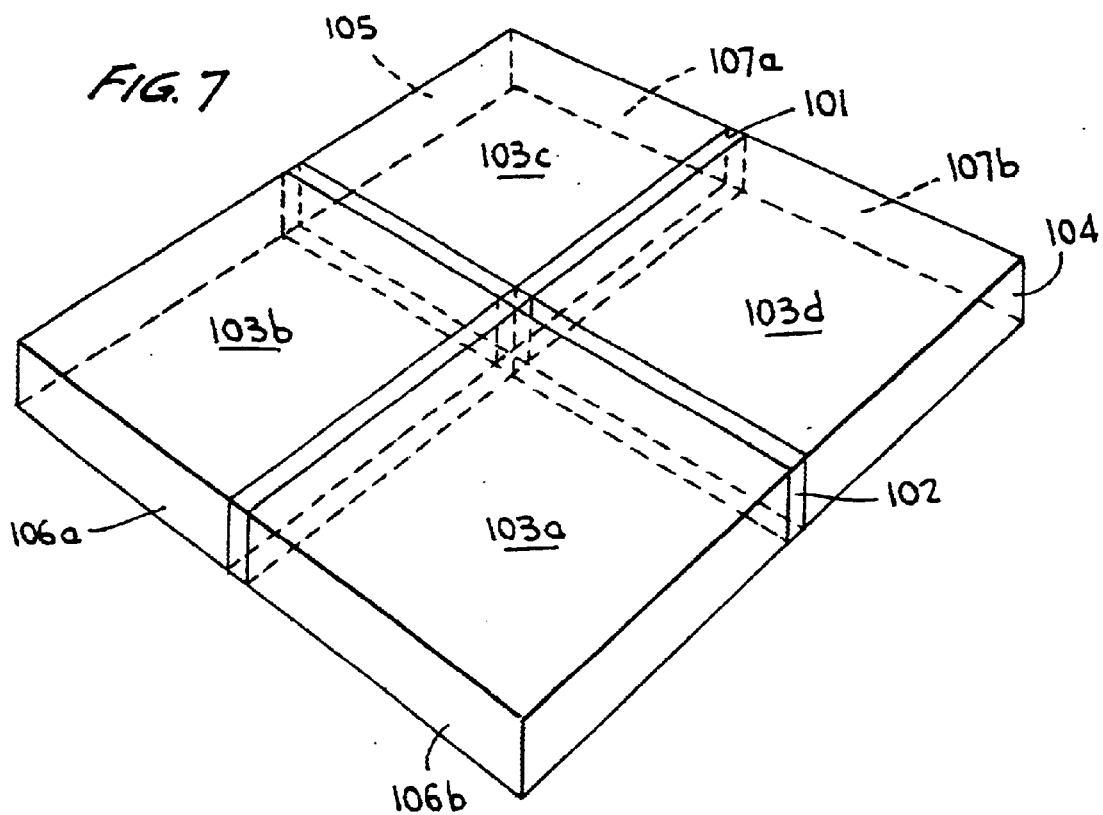

REFUSABLE PERSONAL MONITORING DEVICE

This application claims the benefit of provisional application Ser. No. 60/119,069 filed Feb. 8, 1999.

FIELD OF THE INVENTION

This invention relates to a reusable personal monitor in form of a handsome card providing a quantitative determination of harmful threatening ionizing irradiation.

BACKGROUND OF THE INVENTION

Dosimeters suitable to detect and to quantify harmful or threatening ionizing irradiation are known for years. Especially people working with radioactive isotopes as in analytical research laboratories, in nuclear medical research, in nuclear power-stations and in non-destructive testing of materials should be under permanent preventive controll in order to be informed about the dose of ionizing radiation to which they have been exposed within a well-known working time. Well-known types of dosimeters are e.g. based on CsI-crystal scintillators, mostly in form of a pencil, which provide permanent controll. When a quantified critical or treshold value becomes exceeded, a system in form of a sound alarm may warn the controlled person. Nowadays electronic gadgets such as personal identification, personal "irradiation history", etc., have become available, even in contact with a network, in order to maximize personal security measures.

Another detection system makes use of detectors in form of a badge which, after having been borne during a certain period of time are controlled centrally. Quantifying irradiation can be based on silver halide photography (as e.g. in nuclear power-stations, described as in "Gebrauchsanweisung für das Personendosimeter mit Ganzkörperdosimetersonden, Typ GSF-Film-GD 10/20, GSF-Forschungszentrum für Umwelt und Gesundheit GmbH—Institut für Strahlenschutz—Auswertungsstelle für Strahlendosimeter—Stand: 1 März 1994). Another quantifying method can be based on thermoluminescence (e.g. with LiF detectors) or on PSL-dosimetry wherein phosphate glass becomes stimulated with a pulsed ultraviolet laser and wherein erasure is performed thermically. Advantageously both detection systems based on thermoluminescence and PSL-dosimetry can be reused.

Another detector offering the same advantage of reusability is a stimulable phosphor medium as has been disclosed in EP-A 0 844 497 and in EP-A 0 892 283.

In EP-A 0 844 497 a method has been disclosed of checking whether an article has been inspected by penetrating radiation. In particular however it relates to a method making it possible to check whether if a piece of luggage has been inspected by X-rays and to a method for personal monitoring. Therein a label according to the first embodiment of this invention can beneficially be used as means for personal monitoring. When a person working in an environment with penetrating radiation carries such a label, the label can be used to determine the dose of penetrating radiation absorbed by that person. The amount of energy of the penetrating radiation stored in the phosphor is proportional to the absorbed dose and can be read out and the remaining amount of energy stored in the phosphor can be erased by erasing radiation. It was found that the ease of erasure was related to the energy of the penetrating radiation that irradiated the label. E.g. energy stored in the label by irradiation with $Co^{60}$ (1 MeV) radiation is less easily erased than the energy stored in the label by irradiation with penetrating radiation of 50 keV. Thus the time needed to erase the amount of energy stored in the phosphor to a given level is a function of the energy of the penetrating radiation that left said amount of energy stored in the phosphor and by checking the amount of energy left in the phosphor after a given time the energy of the penetrating radiation can be determined. It is clear that for each type of storage phosphor used in the label a calibration of the readings both to determination of the amount of energy stored and to the determination of the energy of the radiation causing the amount of energy to be stored has to be performed. This can easily be done by irradiating the label with a known dose of penetrating radiation of known energy and reading out the amount of energy stored in the phosphor (this is proportional to the absorbed dose) and erasing the amount of energy stored in the phosphor and controlling at given time intervals the amount of energy left in the phosphor (this is proportional to the energy of the penetrating radiation to which the label with the phosphor has been exposed). The phosphor can be calibrated so that the energy of the penetrating radiation can be assessed by reading the time needed to reach an erasure depth (erasure depth: the degree to which the amount of energy stored has been erased.).

Therefore the invention encompasses a method for personal monitoring comprising the steps of providing a person entering an area where penetrating radiation is used with a label comprising a storage phosphor wherein an amount of energy of said penetrating radiation, proportional to a dose absorbed by said phosphor is stored, reading out said amount of energy stored in said phosphor, assessing said absorbed dose, while leaving a fraction of said stored energy in said phosphor, erasing said fraction of said stored energy from said phosphor by overall exposure to erasing radiation during an erasing time to reach a predetermined erasure depth, and noting said erasure time.

In a label according to the first embodiment of that invention and used for personal monitoring it is possible to incorporate different phosphors for the detection of penetrating radiation of different energy. As suggested it is, e.g. possible to include in the label a first patch of phosphor dedicated to the detection of $Co^{60}$ radiation, a second patch of phosphor dedicated to the detection of $Ir^{192}$ radiation, a third patch of phosphor dedicated to the detection of radiation of X-ray between 50 and 400 keV, a fourth patch of phosphor dedicated to the detection of ultraviolet radiation. It is also possible to cover a label, according to the first embodiment of that invention, used for personal monitoring, wherein only one type of phosphor is present with different filters so that , e.g., on one patch of the phosphor a filter letting only $Co^{60}$ radiation pass is present, on a second patch a filter letting only $Ir^{192}$ radiation pass, on a third patch a filter letting only pass X-rays with energy between 50 and 400 keV, etc.

In a second embodiment of that invention, means for storing energy of penetrating radiation are means that convert the energy of absorbed penetrating radiation into electrons, these electrons being stored in an electronic memory that can repeatedly be read-out.

In EP-A 0 892 283 a personal monitor has been disclosed comprising a storage medium for absorbing incident radiation energy, wherein said storage medium comprises a storage phosphor panel capable to store radiation energy originating from radiation having a wavelength of 350 nm or less, wherein said panel is covered with an optical filter absorbing radiation having a wavelength of 350 nm or more and wherein said panel is present in a housing, being preferably provided with a shutter element to avoid exposure at those moments when it is undesirable or irrelevant. More particularly said incident radiation is therein substantially composed of UV-B and UV-A rays in the wavelength range from 250 to 350 nm and said storage phosphor panel comprises storage phosphors having a dark decay of 2 hours or more as it was an object of that invention to provide a personal monitor as an indicator making it possible to check in a quantitative way any amount of harmful (sun) rays irradiating the human skin, more in particular to provide a quantitative indicator for measuring irradiation of the human skin by (over)exposure to harmful UV-A and UV-B radiation originating from sun-rays and/or solar panels and to provide a method for quantitatively checking the amount of accumulated radiation and comparing it with radiation doses tolerable within a certain exposure time as a function of age, location on earth, skin type, protection factor of sun cream used, etc. Said personal monitor therefore further comprises a digital memory storing medium, preferably an EPROM, a bubble memory, a non-volatile RAM or a magnetic memory.

In the same Application a method to determine in a quantitative way stored amounts of radiation energy originating from radiation having a wavelength of 350 nm or less, has been described wherein said method comprises the steps of:

i) providing a personal monitor as described hereinbefore;
ii) opening the housing of said monitor thereby irradiating said storage phosphor panel covered with said optical filter by incident radiation in such a way that said panel is exposed proportionally and simultaneously with an object which is sensitive to said radiation;
iii) closing the said housing,
iv) reading out said storage phosphor panel by the steps of entering the personal monitor in a read-out apparatus, removing the optical filter covering the storage phosphor panel, adding stimulating-energy to the said storage phosphor panel, digitally detecting energy released from said storage phosphor panel by a detector; and v) erasing stored rest energy.

In that Application said stimulating energy is originated from visible light, from thermal energy or from electroluminescent energy and detecting said released energy proceeds by an optical system comprising a photomultiplier, a photodiode, a phototransistor or a gas detector. Further said optical system collimates light with optical fibres, leading it to a light detector, wherein, before entering said light detector, an optical filter is present absorbing stimulating radiation and transmitting fluorescent light.

An apparatus for readout of storage means according to the method described above is also claimed wherein said apparatus comprises a DSP(digital signal processing)-chip in order to quantitatively determine energy released by said storage means. If disadvantages of those systems are not related with costs as for systems making use of stimulable phosphors, aspects of customization as opening the housing of the personal monitor before exposure (forgetting it makes that the indicator is not exposed at all), entering the personal monitor (indicator) in a read-out apparatus, removing the optical filter covering the storage phosphor panel, etc., will form a barrier and therefore any practical customer-friendly realization, especially with respect to the housing, of a practical and inexpensive personal monitor is desired.

OBJECTS AND SUMMARY OF THE INVENTION

Therefore it is an object of the present invention to provide a practical, inexpensive and customer-friendly personal and reusable monitor in order to determine in an easy and quantitative way stored amounts of harmfull radiation energy originating from ionizing radiation.

Further objects and advantages of the present invention will become clear from the detailed description hereinafter.

The objects of the present invention are realized by providing a device for recording and storing incident radiation energy and for reading said energy comprising:

a stimulable phosphor absorbing and storing said energy and being stimulable with a wavelength $\lambda_a$, an electroluminescent phosphor emitting, upon application of an electrical field, stimulation light with wavelength $\lambda_a$ wherein said device is equipped with means in order to apply an electrical field on said electroluminescent phosphor, and wherein said stimulable phosphor and said electroluminescent phosphor are positioned relative to each other so that said light emitted by said electroluminescent phosphor reaches said stimulable phosphor for stimulating said phosphor in order to release stimulated light as a detectable signal.

Said device is thus realized as a reusable personal monitor in form of a handsome, inexpensive card providing, after reading out the captured irradiation energy, a quantitative determination of harmful threatening ionizing irradiation as will become clear from the description and of the drawings hereinafter.

DESCRIPTION OF THE DRAWINGS

Practically preferred embodiments of the reusable card having means in order to detect irradiation having a certain energy and to be read-out have been demonstrated in the FIGS. 1 to 7, wherein following specific features are present (numbers of layers are given between brackets).

Figure 1:
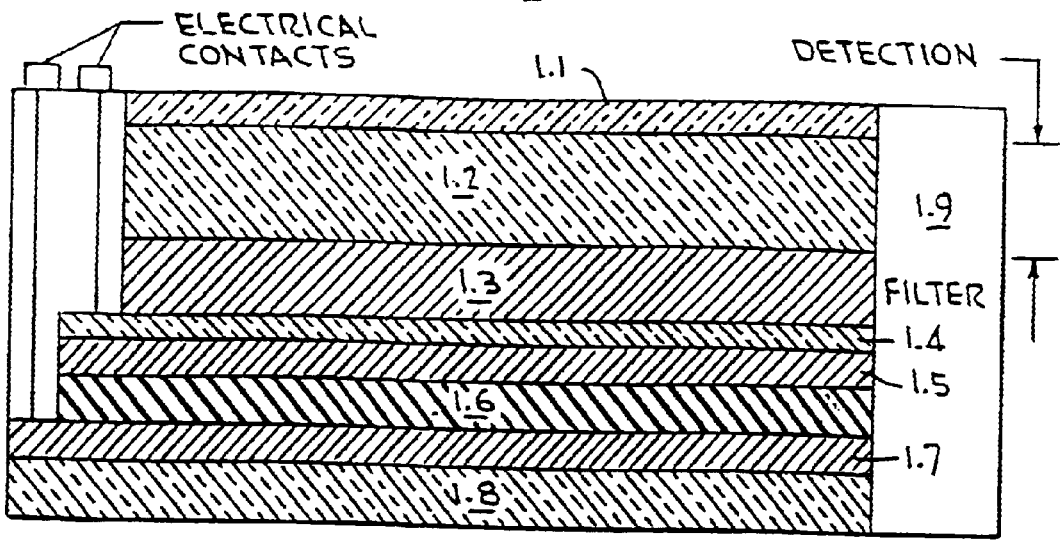
FIG. 1 shows a card containing as outermost layers a layer, reflecting blue light (1.1) and a carrier (support) layer (1.8). The carrier (1.8) can be composed of any material, although polyethylene terephthalate (PET), polyethylene naphthalate (PEN), glass or plastic are preferred. The carrier material offers enough stiffening to the card in order to compensate for the flexibility of the other relatively thin layers.

Optical filters coated as outermost layers (1.1) and (1.8) at both sides of the card are chosen in such a way that the desired wavelength spectrum of irradiation can reach the storage panel in order to get stored energy therein proportional with the incident radiation, whereas undesired radiation is not passing the optical filter layers. In a particular embodiment the filter layers are composed of differing strips each having their own absorption spectrum, differing from each other. As an example thereof strips of Al-filters and of Cu-filters as X-ray filters can be used. Lead-filters are advantageously used, e.g. in an environment wherein materials are tested by means of non-destructive testing materials.

In order to provide electroluminescent stimulation of the energy stored in the photostimulable phosphor layer (1.3) "electrical contacts" are provided in contact with layers situated at both sides of the electroluminescent layer (1.5) (see transparent electrode layer (1.4) and a conductive layer (1.7) in form of a conductive paste). Both layers acting as electrodes have contact points in order to provide contact with a reading apparatus. The layer (1.2) which is transparent for incident radiation to be stored by the storage phosphor particles in the detecting storage panel (1.3) in contact with the transparent layer (1.2) is e.g. a polyester layer—e.g. a PET layer—, a layer of flexible glass, a PVC layer, a polymethyl-methacrylate layer, etc. The function of this transparent layer consists in leading radiation, emitted by the storage or photostimulable phosphors in the storage phosphor layer (1.3) after having been stimulated with electroluminescent radiation coming from the electroluminescent particles in the electroluminescent layer (1.5) via light-piping to the border of the card, surrounded (at least in the part where the read-out step is performed), by an optical filter layer transmitting only radiation emitted by the photostimulated phosphor and not visible radiation coming from the environment, which should make disappear stored *energy. The light emitted under the influence of electroluminescent energy from the electroluminescent phosphors by stimulation of the storage phosphors in the storage panel thus comes in the transparent medium (1.2) (PET, PVC, PMMA, etc . . . ) situated between two reflecting layers (the layer reflecting blue light (1.1) and the storage phosphor layer or panel(1.3)), and is directed to the border of the card by light-piping along a large thin slit and can be read-out, after having passed the (optical) "FILTER" layer (surrounding the edges with an optical filter transmitting exclusively energy released by said storage phosphor panel) by an array of optical fibres(see: "DETECTION"), collecting the light to a photo-multiplier and converting it therein in an electrical signal.

The layer (1.4) representing one of the electrodes as set forth should be transparent in order to provide transmission of light: indium tin oxide (ITO), offers good conductive properties (resistance about 50 Ω/), whereas the less expensive, slightly blue colored PEDT has a resistance of about 2500 Ω/, thus offering slightly less quality, unless it becomes coated in a thinner layer).

As an insulating layer (isolator) the layer (1.6) is containing pigments selected from the group consisting of barium titanate, magnesium oxide and barium silicate.

Stimulation of the electroluminescent layer (1.5) is performed with an a.c. voltage thereby generating an alternating electrical field which makes illuminating the electroluminescent particles (preferably: ZnS:Mn phosphor particles).

A practical, inexpensive and reusable card is thus provided with means to provoke stimulation light in the card itself in order to read-out the storage phosphor panel, wherein said means is a layer comprising electroluminescent material, preferably a ZnS:Mn phosphor.

Figure 2:
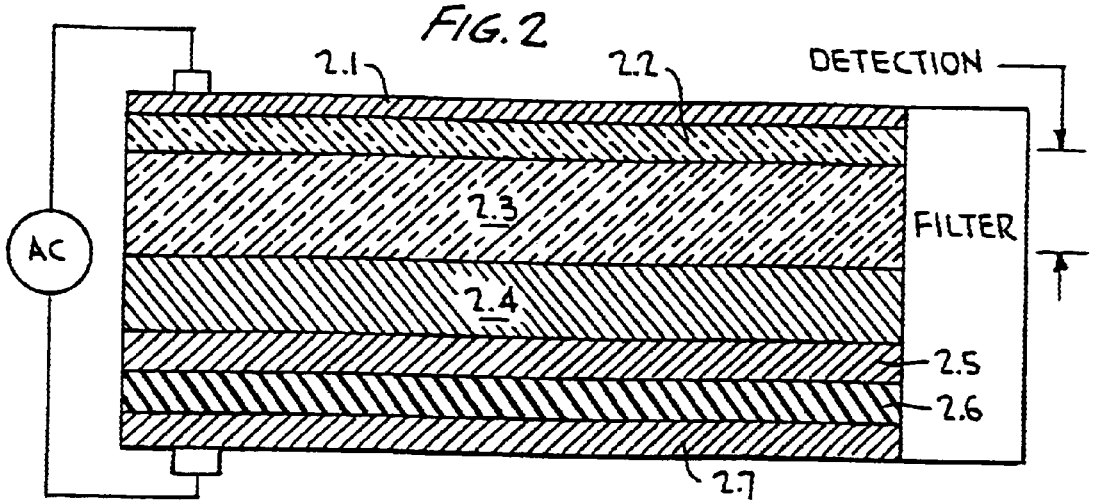

FIG. 2 is illustrative for a layer build-up for the card wherein no carrier layer is present but where the conductive (paste, PEDT. . . ) layer (2.7) is present on one side and wherein the other (non-transparent) electrode (2.1) is present at the other side. This performance allows easy stimulation of the electroluminescent layer by an a.c. voltage source. Moreover none of the electrodes should necessarily be transparent. In order to get the same electrical strength of field however a higher a.c. voltage (delivered by an "AC" source in electrode contact with the non-transparent electrode (2.1) and the conducting (paste) layer (2.7) respectively is required if compared with requirements for the card in FIG. 1. Layer (2.2) represents the layer reflecting blue light; layer (2.3) the transparent medium; layer (2.4) the photostimulable phosphor layer; (2.5) the electroluminescent layer; (2.6) the isolating layer (preferably composed of barium titanate particles); (2.7) the conducting (paste) layer; the (optical) "Filter" layer having the same function as in FIG. 1 and and the "Detection" means, which is represented by an array of optical fibres, collecting the light to a photo-multiplier and converting it therein in an electrical signal, just as in FIG. 1.

Figure 3:
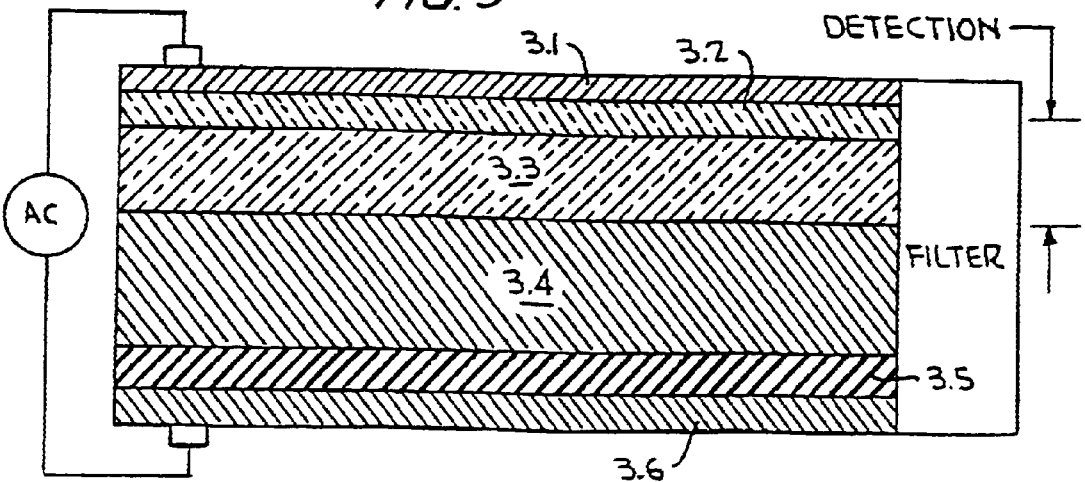

FIG. 3 is illustrative for a less expensive performance of the card, in that the photostimulable layer (storage panel) and the electroluminescent layer are combined in one and the same layer (3.4), whereby coating of a lower amount of layers is achieved in favor of manufacturing cost. The electroluminescent material or phosphor is thus present in the storage phosphor panel or layer (3.4). Other layers in FIG. 3 represent the non-transparent electrode layer (3.1); the layer (3.2), reflecting blue light, the transparent medium layer (3.3); the isolating layer (3.5) preferably composed of barium titanate particles; the conducting (paste) layer (3.6); the (optical) "Filter" layer having the same function as in FIGS. 1 and 2 and the "Detection" means, which is represented by an array of optical fibres, collecting the light to a photomultiplier and converting it therein in an electrical signal, just as in FIGS. 1 and 2 hereinbefore. An a.c. voltage (delivered by an "AC" source in electrode contact with the non-transparent electrode layer (3.1) and the conducting (paste) layer (3.6) respectively is stimulating the luminescent phosphor particles in the layer (3.4), thereby stimulating the storage phosphor particles present in the vicinity in the same layer.

FIG. 4 is illustrative for still another embodiment of the personal monitor according to the present invention. A translucent screen or layer (4.3) offering the advantage of a layer being more transparent for incident radiation is therefore comprising a binder material for the photostimulable phosphor particles and for the electroluminescent particles together (layer mixture as in FIG. 3) which has a refractive index which is differing less from the one of both types of particles. In praxis it is not possible to get a completely transparent layer, as differences in refractive index are still at least about 0.6 (stimulable BaFBr:Eu phosphor particles: 1.6;luminescent ZnS:Mn 2.2) and moreover diffraction is further due to the presence of fine stimulable phosphor particles (having an average diameter of 7 μm, which is relatively small versus the average diameter of electroluminescent ZnS:Mn particles being about 50 μm). A suitable binder medium however is 1,1-bis(4-glycidyl-phenylether)-3,3,4-trimethyl cyclohexane, represented in the formula given hereinafter.

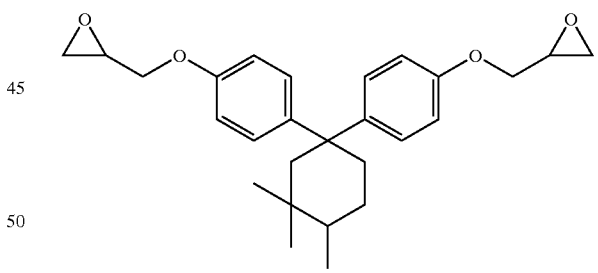

In the embodiment given in FIG. 4 the transparent layer wherein light-piping proceeds (as the layers (3.3) in FIG. 3; (2.3) in FIG. 2 and (1.2) in FIG. 1) can be deleted as light-piping proceeds in the layer combining the storage panel and the electroluminescent layer. Other layers in FIG. 4 represent the non-transparent electrode layer (4.1); the layer reflecting blue light; layer (4.2), the translucent layer (4.3); the isolating layer (4.4) preferably composed of barium titanate particles; the conducting (paste) layer (4.5); the (optical) "Filter" layer having the same function as in FIGS. 1–3 and the "Detection" means, which is represented by an array of optical fibres, collecting the light to a photo-multiplier and converting it therein in an electrical signal, just as in FIGS. 1–3 hereinbefore. An a.c. voltage (delivered by an "AC" source in electrode contact with the non-transparent electrode layer (4.1) and the conducting (paste) layer (4.5) respectively is stimulating the luminescent phosphor particles in the translucent layer (4.3), thereby stimulating the storage phosphor particles present in the vicinity in the same translucent layer. In an alternative embodiment of FIG. 4 the outermost layer is a transparent electrode (e.g. ITO) providing transmission of incident radiation from the side whereupon the said transparent layer is coated. Coating an optical filter thereupon which e.g. blocks radiation having all wavelengths, except for ultraviolet radiation, makes a sun-detector to become available. When the card is exposed to sunlight, therefore making the side coated with the optical filter become exposed by the sun, then the harmfull ultra-violet rays having a wavelength of about 270 nm make the photostimulable phosphor particles become loaded with the corresponding energy, whereas visible light (wavelenghts of more than 400 nm) is blocked, so that no stimulation of the photostimulable phosphor particles in the storage panel occurs.

FIG. 5 provides a particular embodiment wherein structured electrodes (5.1) are available. Said electrodes are preferably present in form of a pattern showing thin parallel lines, where the electrodes at one side are installed into a direction perpendicular to the electrodes at the other side. As electroluminescent signals are only generated at the crossing points of those electrodes whereover an a.c. voltage is run, only one pixel is read-out. In other words the whole plate can be scanned and this technique allows the choice of a direction indicator. Image-wise detection is thus made possible pixelwise. Alternative embodiments provide the possibility to delete the transparent layer (5.5) and to make detection possible by means of multichannel detectors. These photomultipliers with channels, which can e.g. be constructed in two dimensions, are however restricted to a limited number of said channels (64–256). This makes that it is impossible to detect a whole image at once. Use of a multi-channel-detector in form of arrays makes that scanning of different arrays, one line after another, can be performed. Other layers represented in FIG. 5 are the (translucent) layer (5.2) (depending on the choice of the binder material) containing the mixture of luminescent phosphors and storage phosphors; the isolating layer (5.3) and the conducting (paste) layer (5.4). An a.c. voltage (delivered by an "AC" source in electrode contact with the electrodes (5.1) and the conducting (paste) layer (5.4) respectively is stimulating the luminescent phosphor particles in the (translucent) layer (5.2), thereby stimulating the storage phosphor.

FIG. 6A is illustrative for another layer build-up: therein a storage phosphor layer is present at both sides (as layers (6A.3) and (6A.5)) of the transparent medium (6A.4) wherein light-piping proceeds in the detection step: said phosphor layer may comprise a mixture of a photostimulable phosphor and a luminescent phosphor (as represented in this FIG. 6A) or may be build-up of two storage panels at both sides of the "light-piping layer" and coated adjacently to the storage panels an electroluminescent layer situated farther from the said "light-piping layer". As use is made therein of two storage phosphor panels a higher sensitivity is attainable and no additional reflective layer is required as both phosphor layers are reflecting the light emitted by the storage phosphors stimulated by electroluminescent particles, present in one and the same layer (as in FIG. 6A). Layers (6A.1) and (6A.7) each represent a non-transparent electrode layer; layers (6A.2) and (6A.6) each represent an isolating layer. An a.c. voltage (delivered by an "AC" source in electrode contact with the non-transparent electrode layer (6A.7) and the non-transparent electrode layer (6A.1) respectively is stimulating the luminescent phosphor particles in the layers (6A.3) and (6A.5), thereby stimulating the storage phosphor present in the same layers as the said luminescent phosphor particles. The "Detection" means, which is represented by an array of optical fibres, collecting the light to a photomultiplier and converting it therein in an electrical signal, is the same as in FIGS. 1–5 hereinbefore.

FIG. 6B differs from FIG. 6A in that the layers wherein the electroluminescent and the photostimulable phosphor are present are split up again in two layers, adjacent to each other at both sides of the transparent medium (which is composed of polyethylene therephthalate, polymethyl methacrylate, colored glass, etc. . . )layer (6B.5), wherein the electroluminescent layers (6B.3 and 6B.7) are coated in more outermost layers versus the transparent medium layer (6B.5) than the layers with the photostimulable phosphors (6B.4 and 6B.6) that are coated adjacent to the said transparent medium layer (6B.5). Other layers are the non-transparent electrode layers (6B.1 and 6B.9), making contact with the "AC" source; the isolating layers (6B.2 and 6B.8); whereas the "Detection" means is the same as in FIG. 6A hereinbefore.

FIG. 7 represents a so-called "pixel-wise driven electroluminescent (EL) device" as part of a device according to the present invention, said part comprising electrode strips forming the row electrodes (102), positioned basically parallel to each other and isolated from each other, a layer containing an electroluminescent compound (104), electrode strips, isolated from each other forming the column electrodes (106a/b) positioned basically perpendicular to the row electrodes (102). The layer containing the electroluminescent compound is separated both from the row electrode and the column electrodes by a dielectric layer (103a/b/c/d, 105). On top of the column electrodes a protective layer (107a/b) is present. Just as layer (104), the layers (101), (102) and (105) represent reflecting barriers or boundaries, whereas layers forming the column electrodes (106a/b) and protective layer (107a/b) are transparent for stimulated light.

DETAILED DESCRIPTION OF THE INVENTION

Opposite to the practically preferred performance described in EP-A 0 892 283, the housing in the present invention doesn't need to be provided with additional components as e.g. shutters in order to avoid undesired exposure from e.g. daylight. The card is only transmitting light at the edges. Any light from the outside region of the card needs to pass the optical filter that is absorbing all stimulating wavelengths. The detector showing this embodiment is thereby unsensitive for daylight and therefore it does not need to be kept in the dark.

Moreover read-out practice of the stimulable phosphors in the panel doesn't require a complicated read-out apparatus in order to read-out a storage phosphor panel which has an appreciably larger surface if compared e.g. with the small surface of at most a few $cm^2$, corresponding to the shutter opening of the "floppy disk", described in EP-A 0 892 283.

In the present invention the "penetrating X-ray irradiation" generally called "X-ray" irradiation should be understood as any penetrating radiation and includes radiation originating X-rays, α-rays, β-rays, γ-rays, synchrotron radiation, etc., which exists e.g. in the area of non-destructive-testing as well as in the area of medical diagnosis as Ira. radiation originating from a radioisotope (e.g. a $Co^{60}$) source, as well as radiation created by an X-ray generator of any type, radiation of high energy particles created by a high energy radiation generator (e.g. Betatron), radiation from a sample labelled with a radioisotope as is the case in e.g. autoradiography, radiation from an environment wherein non-destructive testing analysis is performed etc. In a more preferred embodiment the radiation energy stored is originating from UV-radiation in the wavelength range from 200 nm up to 350 nm. Preferred optical filters, present as a transparent layer, for use in the personal monitoring device according to the present invention, without however being not limited thereto, are the commercially available filters "U-330" and "U-340", "B-370", "B-380", "B-390", "B-410" and "B-460" from Hoya; the gelatinous "L369"—filter from Agfa-Gevaert and the "UG1" and "UG11" colored filters "BG24", "BG26", "BG14" from Schott. More particularly filters transmitting only ultra-violet radiation are "WG320", "WG280", "BG24", "UG1", "UG11" from Schott and "U-330" and "U-340" from Hoya. A particular advantage of the cited optical filters is offered by their strong tendency to absorb any radiation from the environment being capable of stimulating the photostimulable phosphors. Thereby the personal monitor is made insensitive to undesired effects coming from environmental radiation, probably masking the really desired measurements. An optical filter, as "UG1" and "UG11" from Schott, is preferably used as said filter is transparent for this UV-light, further absorbing all visible light that could stimulate the phosphor. In this case not only the edges but also at least one of the largest sides (the upper side and/or opposite side) of the card is (are) transparent for ultra-violet rays.

The device according to the present invention, set forth in the summary of the invention hereinbefore and as is reflected in the drawings FIG. 1–7, the description of which has also been given hereinbefore, essentially comprises, in order a storage phosphor panel as a storage medium for absorbing incident radiation energy, adjacent thereto at one side a transparent support permitting exposure of said storage phosphor panel with said incident radiation energy, adjacent thereto on the other side and/or incorporated into the storage phosphor panel, thus forming one layer therewith in that case, an electroluminescent layer emitting stimulation light in order to read-out said storage phosphor panel;

adjacent to the said electroluminescent layer and farther from the storage phosphor panel, consecutively an isolating layer and a conducting layer.

The device according to the present invention, the layer build-up of which has been given hereinbefore,thus schematically comprises, in order, said storage phosphor panel, said electroluminescent layer (optionally forming one layer together with the said storage phosphor panel as told hereinbefore), said isolating layer and said conducting layer at both sides of the said transparent support.

Said transparent support is preferably composed of polyethylene terephthalate, polyethylene napththalate, polymethyl methacrylate, polycarbonate, polyvinyl chloride, (colored) glass, etc., without being limitative thereto, and is very suitable to guide the stimulated emission light from the stimulable phosphors in the storage phosphor panel by light-piping to the "detection" unit through a filter layer at the border of the card along a large thin slit. Read-out, after having passed the (optical) "FILTER" layer (as e.g. a "BG3" glass filter), surrounding the edges with an optical filter transmitting exclusively energy released by said storage phosphor panel can proceed by an array of optical fibres(see: "DETECTION"), collecting the light to a photo-multiplier and converting it therein in an electrical signal.

It is clear that-according to the-present invention said means for absorbing UV-irradiation comprises a storage phosphor panel capable to store radiation energy originating from radiation having a wavelength of up to 350 nm which is highly sensitive to the said radiation. In a preferred embodiment storage phosphors or photostimulable phosphors of the storage phosphor panel present in the personal monitor of the present invention are sensitive to a radiation dose of from about 20 mR or more (in the case of "static read-out" or "discontinuous" read-out) of the light emitted by the storage phosphor after stimulation) and even from about 5 mR or more (in the case of scanning of the storage phosphor panel, also called "continuous" or "dynamic" read-out).

Storage phosphor panels or photostimulable phosphor panels are well-known in the field of "digital radiography", also called "computed radiography", wherein a system has been developed wherein X-rays transmitted by an exposed object (such as the body of a patient) are stored in a photostimulable phosphor screen. Systems for computed radiography using storage phosphor technology are commercially available e.g. under trade name ADC70, ADC Compact and ADC Solo from Agfa-Gevaert N.V., Mortsel, Belgium and under trade name FCR7000 and FCR AC1 from Fuji Film, Japan. Such a photostimulable phosphor screen or panel essentially comprises a layer of photostimulable luminescent material which comprises a suitable storage phosphor, a suitable binder material and a support whereto the said supported phosphor layer is adhered. Alternatively said photo-stimulable material is a self-supporting material. Therefore a special type of phosphor is required, known as a "photostimulable phosphor", which, when being incorporated in a panel is exposed to incident pattern-wise modulated X-rays and as a result thereof temporarily stores therein energy contained in the X-ray radiation pattern. At some interval after exposure in the applica-tion as set forth in the present invention electroluminescent energy originating from an electroluminescent layer (thus differing from a beam of visible or infrared light energy known from "classical" computed radiography) stimulates the energy-loaded storage phosphor particles in the storage phosphor panel in order to stimulate release of stored energy as light energy that is detected and converted to electrical signals which can be processed to produce an irradiation energy pattern or spectrum (after pixelwise energy release) or even a visible image (after imagewise exposure followed by pixelwise energy release) or to quantify integral amounts of stored energy. For this purpose, the phosphor should store as much as possible of the incident X-ray energy and emit as little as possible of the stored energy until stimulated by electroluminescent energy.

The storage phosphor coated onto a panel used as a substrate (like the transparent medium e.g.) or a self-supporting storage phosphor panel is most suitable to include the photostimulable phosphor. Depending on the chemical composition the said photostimulable or storage phosphor can be made sensitive in order to capture UV/blue light radiation as has been set forth e.g. in Phys. Review Letter, Vol. 65(19), p. 2438–41(1990); in Prog. Nat.

Sci., Vol.3(2), p. 160–164(1993) and in Phys.Status Solidi, Vol.136(1), p. 241–246(1993).

Examples of stimulable phosphors employable in the radiation image storage panel used in the personal monitor of the present invention include:

SrS:Ce, Sm, SrS:Eu, Sm, ThO$_2$:Er, and La$_2$O$_2$S:Eu, Sm, as described in U.S. Pat. No. 3,859,527;

ZnS:Cu,Pb, BaO.xAl$_2$O$_3$:Eu, in which x is a number satisfying the condition of $0.8 \leq x \leq 10$, and M$^{2+}$O.xSiO$_2$:A, in which M$^{2+}$ is at least one divalent metal selected from the group consisting of Mg, Ca, Sr, Zn, Cd and Ba, A is at least one element selected from the group consisting of Ce, Tb, Eu, Tm, Pb, Tl, Bi and Mn, and x is a number satisfying the condition of $0.5 \leq x \leq 2.5$, as described in U.S. Pat. No. 4,326,078;

M$^{III}$OX:xCe, in which M$^{III}$ is at least one trivalent metal selected from the group consisting of Pr, Nd, Pm, Sm, Eu, Tb, Dy, Ho, Er, Tm, Yb and Bi; X is at least one element selected from the group consisting of Cl and Br; and x is a number satisfying the condition of $0<x<0.1$, as described in JP-A 58-69281;

LnOX:xA, in which Ln is at least one element selected from the group consisting of La, Y, Gd and Lu, X is at least one element selected from the group consisting of Cl and Br, A is at least one element selected from the group consisting of Ce and Tb, and x is a number satisfying the condition of $0<x<0.1$, as described in the above-mentioned U.S. Pat. No. 4,236,078;

(Ba$_{1-x}$,M$^{II}_x$)FX:yA, in which M$^{II}$ is at least one divalent metal selected from the group consisting of Mg, Ca, Sr, Zn and Cd, X is at least one element selected from the group consisting of Cl, Br and I, A is at least one element selected from the group consisting of Eu, Tb, Ce, Tm, Dy, Pr, Ho, Nd, Yb and Er, and x and y are numbers satisfying the conditions of $0 \leq x \leq 0.6$ and $0<y<0.2$ respectively, as described in U.S. Pat. No. 4,239,968;

bariumfluorohalide phosphors as disclosed in, e.g., U.S. Pat. No. 4,239,968; DE OS 2 928 245; U.S. Pat. No. 4,261,854; U.S. Pat. No. 4,539,138; U.S. Pat. No. 4,512,911; EP-A 0 029 963; U.S. Pat. No. 4,336,154; U.S. Pat. No. 5,077,144; U.S. Pat. No. 4,948,696; JP-A 55-12143; JP-A 56-116777; JP-A 57-23675; U.S. Pat. No. 5,089,170; U.S. Pat. No. 4,532,071; DE OS 3 304 216; EP-A 0 142 734; EP-A 0 144 772; U.S. Pat. No. 4,587,036; U.S. Pat. No. 4,608,190 and EP-A 0 295 522;

Ba$_{q-x}$Sr$_x$F$_{2-a-b}$X$_b$:zA, wherein X is at least one member selected from the group consisting of Cl and I; x is in the range $0.10 \leq x \leq 0.55$; a is in the range $0.70 \leq a \leq 0.96$; b is in the range $0 \leq b \leq 0.15$; z is in the range $10^{-7} \leq z \leq 0.15$, and A is Eu$^{2+}$ or Eu$^{2+}$ together with one or more of the co-dopants selected from the group consisting of Eu$^{3+}$, Y, Tb, Ce, Tm, Dy, Pr, Ho, Nd, Yb, Er, La, Gd and Lu, and wherein fluorine is present stoichiometrically in said phosphor in a larger atom % than bromine taken alone or bromine combined with chlorine and/or iodine, as disclosed in EP-A 0 345 903;

alkali metal phosphors comprising earth alkali metals as disclosed in e.g. U.S. Pat. No. 5,028,509 and EP-A 0 252 991;

halosilicate phosphors as disclosed in e.g. EP-A's 0 304 121, 0 382 295 and 0 522 619;

elpasolites as disclosed in EP-A 0 685 548;and halogermanates as disclosed in EP-A's 0 382 295 and 0 504 969.

The above-described stimulable phosphors are given by no means to restrict the stimulable phosphor employable in the present invention. Any other phosphor can be also employed, provided that the phosphor gives stimulated emission when excited with stimulating rays having a wavelength $\lambda_a$ after exposure to the radiation which should be detected. It is understood that this doesn't mean that the stimulating radiation should be perfectly monochromatic and restricted to rays having a wavelength $\lambda_a$, but that the spectrum can be broader, including rays having a wavelength $\lambda_a$, preferably representing therein the rays having the highest intensity.

Barium fluorohalide phosphors, more preferably barium fluorobromide phosphors, and still more preferably europium doped barium fluorobromide phosphors, cannot only be energized to an excited state by X-rays but also by UV-rays, and can then be stimulated by light within a first wavelength range in order to return to the ground state with the emission of light within a second wavelength range.

The stimulating radiation is arranged in order to have a different wavelength from the emitted light. In praxis use is made of a europium activated or doped bariumfluorobromide storage phosphor, wherefore the stimulating light is situated within the range of 600–700 nm (red light, clearly differing from radiation having a wavelength $\lambda_a$ corresponding with energy for which the stimulable phosphor is sensitive to stimulation) and the emitted light is situated within the range of 350–450 nm (blue light).

In the device according to the present invention said storage phosphor absorbing radiation having a wavelength up to 350 nm is coated on a support in form of a powder of phosphor dispersed in a binder. In this case the powder comprises phosphor particles having a particle size distribution with an average volume diameter (dv$_{50}$) between 1 μm and 100 μm. The amount of storage phosphor present on the support of the indicator, in the case of a phosphor powder, ranges from 10 mg/cm$^2$ to 400 mg/cm$^2$, and more preferably the amount of phosphor powder ranges from 20 mg/cm$^2$ to 200 mg/cm$^2$. The storage phosphor can in principle be present as a single crystal on the support of the panel of the device according to the present invention.

As a very inexpensive and very compact stimulating light source an electroluminescent screen or panel is provided in the layer-build-up of the device according to the present invention. Such a screen is compact as it is available as a thin foil. The electroluminescent phosphors used are chosen with respect to the stimulation properties of the storage phosphor to be stimulated.

E.g the electroluminescent element used in order to stimulate a storage phosphor with a maximum stimulability in the red region of the visible spectrum will incorporate an electroluminescent phosphor with a light emission tuned to match said wavelength region. Red emitting electroluminescent phosphors are e.g. ZnS:Mn, a Mn activated fluorphlogopite phosphor with formula KMg$_3$ (Si$_3$Al)O$_{10}$F$_2$:Mn as disclosed in U.S. Pat. No. 5,582,768 and SrS:Eu. A blue-green emitting luminescent phosphor is e.g., SrS:Ce, green emitting luminescent phosphors are, e.g. a Tb activated fluorphlogopite phosphor with formula KMg$_3$ (Si$_3$Al)O$_{10}$F$_2$:Tb or a Ti activated fluorphlogopite phosphor with formula KMg$_3$ (Si$_3$Al)O$_{10}$F$_2$:Ti as disclosed in U.S. Pat. No. 5,582,768.

Blue emitting luminescent phosphors are e.g., Sr$_x$Ca$_{1-x}$Ga$_2$S$_4$:Ce with $0 \leq x \geq 5$ 1, phosphors as described in U.S. Pat. No. 5,598,059, with formula M$^{2+}$M$^{3+}_2$X$_4$:RE, wherein M$^{2+}$ is a metal selected from the group consiting of Mg, Ca,Sr and Ba, M$^{3+}$ is a metal selected from the group consiting of Al, Ga and In, X is an element selected from the group consisting of Se and S and RE is an activator selected from the group consisting of Ce and Eu, a Ti-activated α-Zirconiumphos-phate phosphor with formula $Zr_{1-x}Ti_x(HPO_4)_2 \cdot H_2O$ as disclosed in U.S. Pat. No. 5,582,768. Further useful electroluminescent phosphors have been disclosed in U.S. Pat. No. 5,616,285 wherein electroluminescent phosphors based on lamellar intercalation compounds doped with various dopants in order to select the emission color of the doped compound are disclosed.

According to the present invention said device further comprises an isolating layer which is a layer containing pigments selected from the group consisting of barium titanate, magnesium oxide and barium silicate. Said layer is in all embodiments situated adjacent to the electroluminescent layer and between said layer and the energy source providing energy in order to provoke luminescence of the luminescent phosphors in the said luminescent layer, whereby the luminescent energy is captured by the storage phosphors in the photostimulable phosphor layer.

The transparent electrode layer optionally present as in FIG. 1 (layer (1.4)) should be transparent as electroluminescent light should pass through the layer and reach the photostimulable phosphor particles in order to store energy in an efficient way, even after provoking luminescence of the electroluminescent phosphors by application of a lower voltage over the electrodes if compared with the layer build-up as represented in the other FIGS. 2–6 e.g. where a higher voltage is required due to the larger distance between the electrode layers. Said transparent electrode layer acting as an electrode is a transparent layer of indium-tinoxide (ITO) or of a transparent support carrying a transparent conductive polymer layer composed e.g. of poly-ethylene-dioxythiophene (also called PEDT), polypyrole, polyaniline and the like.

As said device is preferably present in form of a handsome card, just as a credit card, the device has two (parallel) largest sides and surrounding edges which should be covered with outermost layers.

According to the present invention the device thus contains as outermost layers covering said device at one or both sides having the largest surfaces (upside and/or downside) a filter layer absorbing energy which should not be detected during exposure;

at surrounding edges (borders) around those surface layers, a surrounding layer (which at least partially covers said borders), wherein said layer is an optical filter layer transmitting exclusively energy released by said storage phosphor panel.

As light emitted by the photostimulable phosphors after stimulation by electroluminescent light should pass through a thick layer of glass, transmission of said glass for blue light should be high enough. Filter "BG24" from Schott is very suitable therefore. Otherwise, in order to avoid stimulated light to escape from the transparent medium layer a preferably blue light reflecting layer is covering the said transparent medium as is clear e.g. from FIG. 1, layer (1.1).

According to a particular embodiment of the present invention said device has an electroluminescent layer as set forth hereinbefore which is emitting said stimulation light pixelwise in order to read-out said storage phosphor panel "imagewise" with respect to optionally differing energies detected at differing sites on the device (made different e.g. as a consequence of differing filters divided in a predetermined pattern over the surface of the device in order to detect irradiation having differing energies).

Equipping said device with means in order to apply an electrical field on said electroluminescent phosphor by row and column electrodes, provided at both sides of said electroluminescent layer and mounted perpendicularly to each other, coupled to a voltage source adapted for applying an electrical potential to each of said electrodes separately makes the electroluminescent element represent a two dimensional array of pixels. When said electroluminescent element is as large as or larger than the storage phosphor panel to be scanned, then no physical movement is necessary. The stimulating light pixel-wise driven by a matrix electrode structure thus travels over the storage phosphor plate by sequentially switching the pixels of the electroluminescent element on and off followed in between by detection of the subsequent signals representative for the energy pattern absorbed by the storage phosphors during irradiation with differing energies.

Each of the row and column electrodes required to get pixelwise activation by an electrical field of the electroluminescent phosphors and further pixelwise stimulation of the stimulable phosphors in the storage phosphor panel is therefore coupled to a voltage source adapted for applying an electric potential to each of said electrodes separately. When one electrode strip on the support and one electrode strip on the phosphor are coupled to a voltage source, then the respective voltages are chosen such that an electric field with a field strength beyond the threshold for making the electroluminescent phosphor emit light is only reached where both electrodes cross. Thus in operation, e.g., a first voltage is applied to the first row electrode and a second voltage is consecutively applied to each of the column electrodes, thus light is emitted consecutively by all matrix points on the first row, then said first voltage is applied to the second row electrode and said second voltage is again consecutively applied to each of the column electrodes, thus light is emitted consecutively by all matrix points on the second row. Thus a dot of emitted light equal in size to the pixel created by the row and column electrodes travels over the entire surface of the electroluminescent panel and can pixel-wise stimulate the storage phosphor. The voltage source for driving the electrodes can be a DC-voltage source as well as an AC-voltage source, the latter being preferred.

The electroluminescent element for use in the device of the present invention can be pixel-wise driven by a passive matrix electrode structure as well as by an active matrix electrode structure. An electroluminescent element pixel-wise driven by an active matrix electrode structure is preferred for use in the present invention. Since the EL-element is only intended to stimulate a storage phosphor, it is only needed to drive the element on an on or out basis (binary driven). Thus the driver can be made quite simple, even for a pixel-wise driven electroluminescent device.

The electroluminescent element for use in the device of the present invention may further comprise any additional layer necessary for the functioning of it: it can, e.g., comprise isolating layers for isolating the electroluminescent compound from the electrodes, protective layers on top of the electrodes, barrier layers for protecting the element from moisture, etc.

Active matrix electroluminescent elements for use in the device of the present invention have e.g. been disclosed in U.S. Pat. No. 5,767,623; 5,650,692; U.S. Pat. No. 5,712,528; etc. These are AC-driven thin film electroluminescent elements (AC TFEL). Also electroluminescent thick film materials as described in, e.g., WO 93/23972 are very useful in the device of the present invention. The electroluminescent elements for use in the device of the present invention need only to emit monochrome light.

In an electroluminescent element to be used in the device according to the present invention the row electrodes or the column electrode or both are transparent electrodes, e.g. made of a transparent support with a layer of indium-tinoxide (ITO) or of a transparent support carrying a transparent conductive polymer layer as already mentioned hereinbefore.

The electroluminescent compounds used, inorganic as well as organic, are chosen with respect to the stimulation properties of the storage phosphor to be stimulated. So e.g. the electroluminescent compound used to stimulate a storage phosphor with a maximum stimulability in the red region of the visible spectrum, will incorporate an electroluminescent compound with a light emission tuned to match said wavelength region. The use of an electroluminescent element comprising an inorganic electroluminescent compound (an electroluminescent phosphor) to stimulate a storage phosphor in a method according to this invention, is preferred, since such devices require generally lower voltage for its activation.

According to the present invention a device is provided which is sensitive to incident radiation energy which has a wavelength of 350 nm or less. Said incident radiation energy is thus measured integrally or as a spectrum of differing energies, depending on the integral or pixel-wise read-out of the device as described hereinbefore. During exposure said filter covering the largest surface sides from the device according to the present invention absorbs radiation having a wavelength of 350 nm or more. The storage phosphor panel (supported or self-supporting) making part of the device according to the present invention, after being exposed to irradiation thus stores part of the energy of the X-rays and is in such a position with respect to the EL-layer that the light emitted by the EL-layer can reach the storage phosphor and stimulate the phosphor in order to release the stored energy. By doing so, at least part of the stored energy is released as stimulation light. As the amount of stimulated light is proportional to the amount of energy stored in the storage phosphor, the stimulated light can then be captured and converted to an electric signal for further processing.

In a particular embodiment wherein pixel-wise read-out is particularly preferred the device according to the present invention has a filter layer which is divided over its surface in differing parts absorbing radiation of differing energies in order to selectively detect differing incident radiation energy, originating e.g. from differing radiation sources having a wavelength of 350 nm or less. According to one embodiment the device according to the present invention is then e.g. covered with a lead filter having differing thicknesses or, depending on the energies to be detected, differing metal filters, for the said differing parts of the surface. Such a device has been represented in FIG. 7, the different parts of which have been explained hereinbefore. In a particular embodiment as in this FIG. 7 the electroluminescent device, normally consisting of one unit, has been divided into 4 separate units (see parts 103 *a,b,c* and *d*), which can have been constructed as a whole or apart and be brought together, wherein part (103*a*) is e.g. sensitive for energies of a $Co^{60}$-source and even higher; wherein part (103*b*) is e.g. sensitive for energies of an $Ir^{192}$-source, part (103*c*) for energies between 50 and 150 nm and part (103*d*) for ultraviolet rays. It is clear that such division of the device as presented hereinbefore is not limitative and that alternatives with respect to shape and energy to be detected are also possible. So it may be favorably to adapt the sensitivity of the different parts of the device in order to make it useful in an environment wherein materials are examined by means of non-destructive testing methods, making use therefore from radiation having energies of about 200 keV as has been illustrated e.g. in EP-A's 0 620 482, 0 620 483, 0 620 484, 0 621 506 and 0 698 817. The filters are then preferably arranged in a pattern in order to admit suitable pixel-wise read-out thereof.

Capturing of the stimulated light can be performed by a light guiding member to a photomultiplier in the same way as it is done in methods wherein the storage phosphor panel is pixel-wise stimulated by a laser beam as in digital radiography. The capturing means for the stimulated light as described above (a line- or matrix type array of CCD's or a line or matrix type of a gaseous photon-detector) can be used when the storage panel is stimulated by a pixel-wise driven EL-element. Besides charge couple devices (CCD's), a matrix of gaseous photon detectors or a line or matrix shaped detector containing α-Si coupled to TFT's (Thin Film Transistors) can be used. Very useful gaseous detectors for use as means for pixel-wise capturing the stimulated light have been disclosed in e.g. EP-A 0 846 962. In that disclosure an X-ray image detector comprising a two-dimensional position-sensitive, gaseous photon detector is disclosed comprising an X-ray sensitive storage means for storing an X-ray image, which storage means is capable of emitting image-wise modulated light and two-dimensional position-sensitive gaseous photon detector, arranged to detect said image-wise modulated light, said two-dimensional position sensitive gaseous photon detector comprising a photocathode arranged for receiving image-wise modulated light emitted by said storage means and being operative to provide in response to said image-wise modulated light an output of electrons, a gaseous electron multiplier being operative on the output of electrons from said photocathode to provide an electron avalanche comprising an increased number of electrons, an electrode assembly comprising at least one anode and at least one cathode, said electrode assembly being arranged to collect electrons produced by said electron multiplier.

The stimulated light can be coupled to the capturing means by means of a self-focusing lens or by means of an array of tapered or non-tapered optical fibres. When using a line shaped capturing means this is preferably as long as the longest dimension of the line-shaped EL-element, which in turn is preferably as long as one of the two dimensions of the storage panel to be stimulated. When the dimensions of the pixel-wise capturing means are smaller than the dimensions of the EL-element, the stimulated light can be guided to the pixel-wise capturing means by tapered optical fibres. The pixel-wise two dimensional light capturing means having an area large enough to cover at least the total area of the phosphor panel that is stimulated can be a single light capturing means, or can be made up by juxtaposition of several smaller light capturing means. Such means made up by juxtaposition of several smaller capturing means for the stimulated light from a storage phosphor panel with CCD's are disclosed in European application 98200152.1 filed on Jan. 20, 1998, titled "Method for obtaining an electrical representation of a radiation image using CCD sensors".

From the foregoing disclosure it becomes clear that the most simple device according to the present invention is a device incorporating:

a non-pixel-wise driven EL-element a storage phosphor layer adjacent to the EL-layer a matrix shaped capturing means for pixel-wise capturing the stimulated light.

In such a device the EL-layer, the storage phosphor layer and the matrix shaped capturing means preferably have the same area. The matrix shaped light detector for pixel-wise capturing the stimulated light can be a two-dimensional matrix of charge couple devices (CCD's) as well as a two dimensional matrix of a gaseous photon detectors.

In such a device the electroluminescent layer, the storage phosphor layer and the matrix shaped capturing means have the same area. The phosphor part and the electroluminescent part can be glued together by an adhesive between the support of the storage phosphor part and the protective layer. It is also possible to apply the storage phosphor directly on the protective layer and to omit the support. Structuring the device in this way can increase the achievable image quality. Any other way of combining the electroluminescent part and the phosphor part of the device can be used as well, e.g. both parts can be kept together by electrostatic attraction, by clamping the sides of the device together, etc. Moreover coating electroluminescent particles and stimulable phosphor particles in one and the same layer is also possible as has been illustrated in the Figures.

It is clear that the objects of the present invention are further realized by providing a method to determine in a quantitative way stored amounts of said incident radiation energy comprising the steps of:

i) providing a device as set forth hereinbefore;
ii) irradiating said device by incident irradiation from the environment in such a way that the said storage panel comprising stimulable phosphor particles is exposed proportionally and simultaneously with an object which is sensitive to said radiation and which should not necessarily be closed or covered after irradiation in order to avoid irradiation with energy sources having undesired wavelengths;
iii) reading out said storage phosphor panel by provoking stimulation of said storage phosphors energy release by at least one electroluminescent layer emitting stimulated light;
iv) digitally detecting energy released from said storage phosphor panel by a detector capturing said energy;
v) erasing stored rest energy.

In a particular embodiment in order to absorb or capture energy and reproduce quantitatively said energy originating from penetrating radiation having differing energy by the device according to the present invention following steps are required in the method according to the present invention:

i) exposing the storage phosphor to penetrating radiation,
ii) storing energy from said penetrating radiation in said storage phosphor,
iii) releasing at least part of said stored energy as stimulated light with wavelength by stimulating said phosphor with electromagnetic radiation with wavelength above 400 nm and
iv) reading said stimulated light, characterized in that said phosphor is stimulated by electromagnetic radiation emanating from a pixel-wise driven electroluminescent device.

Provoking stimulation by electroluminescent energy generated from said electroluminescent layer thus proceeds, in a preferred embodiment, by electrical excitation along two electrode layers at both sides of the storage panel(s) in order to be coupled to a voltage source adapted for applying an electrical potential between said two electrode layers. Said two electrode layers therefore preferably represent a matrix of row and column electrodes, present at one and the other side of the electroluminescent layer respectively and mounted perpendicularly to each other, in order to be coupled to a voltage source adapted for applying an electrical potential to each of said electrodes separately.

As already set forth the stimulated light generated into the device according to the present invention is detected as a signal by capturing means and brought to a photomultiplier where the said signal is further processed. The stimulation light thus leaves the storage panel and is captured by capturing means and is brought to a photomultiplier where the signal is further processed. The device according to the present invention preferably has as capturing means a line of optical fibers. According to the present invention the detectable signal(s) is(are) processed and stored in an electronic memory or chip, wherein said electronic memory is a DSP(digital signal processing)-chip. The card itself thus preferably comprises an electronic memory being a DSP (digital signal processing)-chip in order to quantitatively determine the irradiation energy captured between the time of entering e.g. a harmfull irradiation zone and leaving it as e.g. in a nuclear power-station, or, in terms of "sun-monitoring", during the time a person has been irradiated by the sun. As the energy released by the storage panel after such an irradiation time or interval is proportional with the energy captured by the subject or by the person the said energy can be determined quantitatively and be stored in the said DSP-chip. Said DSP-chip moreover offers digital data of quantitatively detected integral overexposure or underexposure dose of radiation having a wavelength of 350 nm or less, by calculation e.g. of the difference between detected radiation values and maximum tolerable values per irradiation period (expressed as body equivalent). Means can further be provided to connect the DSP-chip with a network in order to transfer digitally stored data with respect to irradiation of the device according to the present invention (being proportional with irradiation of a person and/or an object in proximate contact therewith) to a central computer. The divice according to the present invention is thus a personal monitor for use as an indicator of the said incident radiation and comprises means for absorbing said incident radiation, wherein the said radiation is proportionally sensitive to the said radiation when simultaneously with the said indicator an object (as the human body) is exposed thereto. In a particular embodiment in the context of the present invention radiation energy having a wavelength of 350 nm or less and, in particular, incident radiation substantially composed of UV-B and UV-A rays in the wavelength range of from 250 to 350 nm is simultaneously captured by means comprising a storage phosphor panel and by the human skin, exposed to said incident radiation, originating from sunlight or from solar panels present in "solar centres". In order to store and to accumulate radiation energy from sun light or solar panels it is recommended to store said energy in order to be able to read it out afterwards.

The personal monitor or indicator as device according to the present invention thus accompanying the person who wants to know what dose of harmful irradiation he/she has captured during the time he/she has been exposed to the said radiation doesn't need to be provided with a shutter element in order to start exposure by said irradiation.

After read-out of the storage phosphor panel stimulated by electroluminescence and processing of the results, taking into account the registered data, the processed data can be compared with data about maximum tolerable exposure times for differing energy levels stored e.g. digitally in look-up tables which may be present in a read-out apparatus or on the net-work with which a connection is provided.

The results obtained are then stored in digital form in a digital memory storing medium in the personal monitor or via a network with hospitals. A report on the display of the read-out apparatus may appear and the report can be made available to the interested person as a hard-copy, in form of e.g. a printed ticket. On that ticket the time of exposure and the recommended maximum tolerable time for differing exposure energies that have been captured may appear. Moreover a personalized preview for the maximum tolerable irradiation which is acceptable for that day and for the following day or days (e.g. over a period of the coming 3 days) is preferably reported. This value can also further be stored on the said digital memory storing medium making part of the personal monitor device according to the present invention.

The person being exposed to irradiation having differing energies is thus able to controll if the daily irradiation exposure is still within the tolerable boundaries in order to detect possible health risk in the future.

It is further required that the storage phosphor panel of the personal monitor device according to the present invention comprises storage phosphors having a dark decay of more than 2 hours in order to be able to read out the stored energy with high enough a precision in the dedicated read-out apparatus which will be described hereinafter in different embodiments.

In praxis it is necessary to read out and to get an acceptable result, even 15 hours after ending irradiation exposure. The phenomenon called "dark decay " should be understood as follows. A storage phosphor, having stored energy after being exposed to incident radiation as in this application, can release said stored energy also without irradiation by stimulation light. This way of releasing energy is called "dark decay". The dark decay is determined by a procedure wherein irradiation of the phosphor proceeds by radiation of 70 kVp, immediately followed by stimulating said phosphor by a He-Ne laser of 30 mW. The fluorescent light emitted by the phosphor upon stimulation is then collected and brought e.g. to a photomultiplier (as e.g. the commercially available HAMAMATSU R 376) giving a corresponding electrical current, proportional to the amount of initially emitted fluorescent light. The irradiation of the phosphor with the said radiation can be repeated, but the reading of the amount of stimulable light for a given intensity of stimulating energy can only take place after keeping the irradiated storage phosphor with its stored energy for a given time in the dark. This process is repeated and the time after which the emitted fluorescent light (and thus the energy remaining in the phosphor) of a phosphor kept in the dark, has fallen to a level equal to 1/e ("e" being the basic number for natural logarithm scale) is recorded as "dark decay". In the practical embodiments of the present invention the storage phosphor preferably has a dark decay longer than 120 minutes (2 hours) and preferably even much larger.

In praxis use is therefore made from mathematical algorithms in order to average differing measuring points to only one number and in order to integrate the signal numerically in order to calculate the corresponding energy contents. Calculation of a theoretical analytical function by means of square root analysis makes all measuring points useful as noise has a relatively less strong influence. Moreover the presence of coincident peaks due to disturbing voltage peaks is less disturbing.

In order to perform these calculations two analytical functions are useful:

a function expressing an exponential decay (see formula I)

$$y(t)=A*E^{-t}+B \qquad (I)$$

and a function expressing a "power law" (see formula II)

$$y(t)=A*(t+Tx)^{-n}+B \qquad (II)$$

wherein

A is the amplitude of the signal;

B is the correction for the zero reference line (correcting the base line).

Other symbols will be explained hereinafter.

Formula (I), expressing exponential decay corresponds with a hyperbolic function, with a shifted x-axis.

Formula (II) is the best function fitting experimentally measured data and is therefore used in praxis in order to perform automatic corrections: in the apparatus for read-out of storage means according to the method described hereinbefore, said apparatus further comprises a DSP(digital signal processing)-chip permitting to quantitatively determine energy released by said storage means. Data about tolerable exposure times or about tolerable exposure energy as a function of external factors mentioned above are available from look-up tables and are further stored on the said DSP-chip. The said DSP-chip moreover determines the decrease of the signal caused by dark decay or overexposure with visible light. Dark decay and/or overexposure with visible light indeed make the stored energy in the storage phosphor decrease.

The results with respect to stored exposure energy are thus lower than those of the real signals obtained. If we start from the assumption that the power law set forth hereinbefore is the most suitable theoretical function expressing the decay, then the starting point measured is shifted with respect to the point corresponding with the really captured energy: the first part of the expected graphical representation thus fails. After fitting the curve another value of Tx will be found, but the same value of A (the amplitude) and n (the power). The value of n only depends on the type of storage phosphor used and may be considered constant. In that case integration under the curve from a value -Tx to infinity is proportional to the amplitude and is independent on the other parameters.

To summarize: when the energy stored in the storage phosphor has been diminished due to dark decay or (false light) exposure, then the first part of the curve is not measured. Nevertheless kinetics has been unchanged, so that after fitting the curve by means of the "power-law" algorithm the amplitude corresponding with the original signal is found back again, independent on dark decay and on false visible light exposure. As a consequence it is even not required to know or to indicate the time interval between irradiation exposure and the time the indicator has been put into the read-out apparatus. Even the incident visible light intensity is not important. It is clear that the accuracy with which the correction is performed is depending on the accuracy with which the theoretical function has been determined. Therefore the calculation is performed in double precision mode (32 bit numbers). Another factor determining the accuracy is the weakening of the signal or the decay time: although the calculation still leads to perfect results, even with a weakening factor of 2, such high precision can only be attained if such a "half-life" is not exceeding a recommended time interval of about 15 hours. The said time interval however is really sufficient to detect the dose captured in one day. Application of the "power law" method described above permits a reproducible detection of a minimum dose of 10 µR (88 nGray) with a standard deviation of at most 5%.

In order to further improve the "power law" method, thereby permitting reproducible detection of a minimum dose of 2 µR (20 nGray) with a deviation of at most 5%, moreover improving the reproducibility to detect a higher dose than the said minimum dose of 2 μR with a deviation of even at most 3%, following measures were taken.

The measured curve was fitted now with a theoretical power law according to the formula (III):

$$y(t)=A*(t+t_0)^{-n} \tag{III}$$

Fitting proceeds by means of a least square analysis. Parameters A, $t_0$ and n are determined in such a way that the sum of the squares of the deviations between the measured curve and the theoretical curve is minimized. Taking into account the values so obtained, permits to generate a theoretical curve, showing no noise anymore. Integration under the said generated theoretical curve from the start of the curve up to the "1/e"-line makes improve the reproducibility as set forth hereinbefore (up to a standard deviation of 3%, even at a low dose) and allows to detect a minimum dose of 2 μR, being equivalent with a dose of 20 nGray.

Preferred read-out providing means are further described hereinafter.

The irradiation of the phosphor with penetrating radiation is repeated, but the reading of the amount of stimulable light for a given intensity of stimulating energy only takes place after keeping the irradiated phosphor for a given time in the dark. This process is repeated and the time after which the emitted fluorescent light, (and thus the energy remaining in the phosphor) of a phosphor kept in the dark, has fallen to 1/e is recorded as "dark decay".

A storage phosphor, for use in the first embodiment of this invention, has preferably a dark decay longer than 120 minutes (2 hours).

After reading out the energy stored in the storage phosphor it is clear that no rest energy should be left in order to prevent an intolerable increase of the stored energy after a next exposure. Therefore an indicator according to the present invention has a storage phosphor panel comprising storage phosphors with an electronically erasable memory, wherein erasure is performed in the case of reusable personal monitors or devices as in the present invention at the end of the readout procedure in the apparatus wherein the loaded stimulable phosphor is read out. The light tight covering of the phosphor further offers the advantage that a storage phosphor with high "erasability" but with slow "dark decay" can advantageously be used in the context of the present invention.

After read out, the-photostimulable phosphor layer is subjected to an erasure operation in order to remove any residual image left in the layer with the purpose to re-use the indicator. In practice the stored radiation energy is not completely eliminated by the read out process. In order to make the screen reusable, it is fed from the readout station in the apparatus to an erasing station, where part of the energy still remaining in the phosphor after read out is erased by subjecting the screen to a uniform illumination by means of erasing light. But even if a photostimulable phosphor screen is erased after being read out, it is still possible that residual energy is left on the read out screen or panel. This may be caused by non-optimal adjustment or control of the amount of erasing energy that is applied to the photostimulable phosphor screen.

Non-optimal adjustment of the applied amount of erasing energy may be the result of the fact that the period of time during which a photostimulable phosphor screen is subjected to erasing light is too short (for example as a result of incorrect transport speed of the screen), or that the amount of energy emitted by the erasing light sources to the phosphor screen to be erased does not correspond with the set amount (for example due to a failing lamp), etc. Only few of the possible causes have been mentioned, other causes may be envisaged. When a storage panel that has not been erased to an acceptable level is re-used and again exposed to radiation, the residual signal left in the screen will be detected accumulatively.

Erasure of photostimulable phosphor screens is well-known in the art and can e.g. be obtained by subjecting the layer to an overall illumination with light within the stimulation wavelength range, wherein this stimulation wavelength can again be generated via electroluminescent layers or panels. During the erasure operation the high voltage supply is turned off in the case wherein a photomultiplier is used in order to prevent damaging of the read out, electronics. The read out electronics are also subjected to a reset operation before being used to read a subsequent radiation dose.

In analogy with EP-A 0 345 832 a method and an apparatus for recording and reading out radiation signals can be applied. The apparatus therefore comprises a circulatory feed system for feeding photostimulable phosphor sheets (comprised in a device) along a predetermined circulatory feed path comprising in sequence an exposure unit, a read out unit and an erasure unit. Prior to successive recording of images on the sheets, any remaining images are erased therein. After erasure the sheet is again read out and the signal level is threshold.

If the signal level is higher than a certain level, then the remaining image is erased again in the image erase unit. The erasure step is repeated until the remaining image is sufficiently small.

The apparatus thus provides a method of reading an amount of radiation energy stored in a photostimulable phosphor panel of the device according to the present invention, comprising as steps:

1) exposing said screen with stimulating electroluminescent radiation,
2) detecting light emitted upon stimulation,
3) converting detected light into an electric signal representation of said image,
4) subjecting said screen to erasing light in order to obtain an erased screen,
5) applying steps 1 to 3 to at least part of said erased screen,
6) thresholding an electric signal obtained as a result of step (5) by means of a threshold signal value representative of a maximum amount of emitted light that is allowed to be detected on an erased screen, wherein said erased screen is scanned in step (5).

The energy remaining in the panel after erasure should be sufficiently small. Preferably the signal level detected when the panel is read a second time at highest machine sensitivity is a 1000 times smaller than the maximum dynamic range of the read out apparatus at said highest sensitivity.

In case the signal resulting from step (5) exceeds a preset threshold signal value, this indicates that the stimulable phosphor layer has not been erased to an adequate extent allowing re-use of the device. In this case the panel should be erased once more or it is to be decided that the particular device cannot be re-used further. In that case the apparatus can swallow the device in order to recycle the different components thereof, as e.g. particularly the housing and the phosphor thereof.

Another aspect of the present invention relates to an apparatus for reading a radiation signal (irradiation energy) that has been stored in a photostimulable phosphor panel comprising (i) a read out unit with means for scanning the storage phosphor layer of the device by means of stimulating radiation and means for detecting light emitted by said layer upon stimulation by electroluminescence and converting detected light into a first electric signal representative of said radiation signal, (ii) an erasing unit for subjecting the device to erasing light in order to obtain an erased device, (iii) means for transporting the device from said read out unit to said erasing unit, wherein said apparatus further comprises (iv) means for transporting an erased device from said erasing unit through a read out unit, (v) means for thresholding a second electric signal obtained by scanning at least part of an erased screen with stimulating radiation when it is transported through the read out unit, by detecting light emitted thereby and by converting said light emitted thereby into an electric signal, by means of a threshold signal representative of a maximum amount of emitted light that is allowed to be detected when an erased device is scanned.

In a preferred embodiment the apparatus of the above-described kind has a single read-out unit. Such an apparatus is particularly advantageous from the viewpoint of economy and compact design.

In a read-out apparatus according to this preferred embodiment a read out unit is preferably located in between the input of the apparatus and the erasing unit.

In a further preferred embodiment the apparatus further comprises means for transporting the device from the input unit via the read out unit to the erasure unit and means for reversing the transport direction so that the panel is transported from the erasure unit through the read out unit to the input unit.

Preferably the means for transporting the panel performs the transport substantially in a single plane.

Upon termination of the read-out operation, the phosphor is stimulated for a longer time with the same electroluminescent irradiation in order to erase the phosphor. It can also be transported to a special erasing unit but it is clear that this embodiment is in favor of saving time and space. After erasing the phosphor is measured again. This residual signal is compared with the first signal and the difference between these signals is representative for the dose.

While the present invention has be described in connection with one or more preferred embodiments thereof, it will be understood that it was not intended to limit the invention to those embodiments. On the contrary, it was intended to cover all alternatives, modifications and equivalents as included in the spirit and scope of the invention and as defined by the claims.

What is claimed is:

1. A device for recording and storing incident radiation energy from outside of the device and for reading said energy comprising:

a stimulable phosphor which absorbs and stores said energy and is stimulable by a wavelength $\lambda_a$, an electroluminescent phosphor emitting, upon application of an electrical field, stimulation light with said wavelength $\lambda_a$, wherein said device includes means to apply an electrical field on said electroluminescent phosphor, and wherein said stimulable phosphor and said electroluminescent phosphor are positioned relative to each other so that said light emitted by said electroluminescent phosphor reaches said stimulable phosphor to stimulate said phosphor to release stimulated light as a detectable signal.

2. A device according to claim 1, further comprising, in order, from the outside of the device where incident radiation comes in:

an outermost layer covering said device at a largest side of the device, said outermost layer being a filter layer which absorbs energy which is not to be detected during exposure of the device;

a transparent layer;

a storage phosphor layer comprising the stimulable phosphor, a transparent electrode layer, an electroluminescent layer comprising the electroluminescent phosphor, an isolating layer, a conductive layer, a carrier support layer, and at surrounding edges of each layer, a surrounding layer which is an optical filter layer transmitting exclusively energy released by said storage phosphor layer upon stimulation of the stimulable phosphor.

3. A device according to claim 1, further comprising, in order, from the outside of the device where incident radiation comes in:

an outermost layer covering said device at a largest side of the device, said outermost layer being a filter layer which absorbs energy which is not to be detected during exposure of the device;

a transparent layer;

a transparent electrode layer, a layer comprising the electroluminescent phosphor and the storage phosphor, an isolating layer, a conductive layer, a carrier support layer, and at surrounding edges of the layers, a surrounding layer which is an optical filter layer transmitting exclusively energy released by said storage phosphor layer.

4. Device according to claim 2, wherein the outermost layer, the transparent layer, the storage phosphor layer, the transparent electrode layer, the electroluminescent layer, the isolating layer and the conductive layer are present, in said order, at both sides of said carrier support layer, inclusive of the surrounding layer.

5. Device according to claim 3, wherein the outermost layer, the transparent layer, the transparent electrode layer, the layer comprising the electroluminescent phosphor and the storage phosphor, the isolating layer and the conductive layer are present, in said order, at both sides of said carrier support layer, inclusive of the surrounding layer.

6. Device according to claim 1, wherein said electroluminescent phosphor emits said stimulation light pixelwise in order to read-out said stimulable phosphor imagewise, and said device further comprising means to apply an electrical field on said luminescent phosphor by row and column electrodes provided at both sides of said electroluminescent phosphor and mounted perpendicular to each other and coupled to a voltage source adapted for applying an electrical potential to each of said electrodes separately.

7. Device according to claim 2, wherein said electroluminescent layer emits said stimulation light pixelwise in order to read-out said storage panel imagewise, and said device further comprising means to apply an electrical field on said electroluminescent phosphor by row and column electrodes provided at both sides of said electroluminescent layer and mounted perpendicular to each other and coupled to a voltage source adapted for applying an electrical potential to each of said electrodes separately.

8. Device according to claim 3, wherein said electroluminescent layer emits said stimulation light pixelwise in order to read-out said storage panel imagewise, and said device further comprising means to apply an electrical field on said electroluminescent phosphor by row and column electrodes provided at both sides of said electroluminescent layer and mounted perpendicular to each other and coupled to a voltage source adapted for applying an electrical potential to each of said electrodes separately.

9. Device according to claim 1, wherein said incident radiation energy from the outside of the device has a wavelength $\lambda_a$ of 350 nm or less.

10. Device according to claim 2, wherein during exposure of said device to said incident radiation energy, said filter layer absorbs radiation having a wavelength of 350 nm or more.

11. Device according to claim 3, wherein during exposure of said device to said incident radiation energy, said filter layer absorbs radiation having a wavelength of 350 nm or more.

12. Device according to claim 4, wherein during exposure of said device to said incident radiation energy, said filter layer absorbs radiation having a wavelength of 350 nm or more.

13. Device according to claim 5, wherein during exposure of said device to said incident radiation energy, said filter layer absorbs radiation having a wavelength of 350 nm or more.

14. Device according to claim 6, wherein during exposure of said device to said incident radiation energy, said filter layer absorbs radiation having a wavelength of 350 nm or more.

15. Device according to claim 7, wherein during exposure of said device to said incident radiation energy, said filter layer absorbs radiation having a wavelength of 350 nm or more.

16. Device according to claim 8, wherein during exposure of said device to said incident radiation energy, said filter layer absorbs radiation having a wavelength of 350 nm or more.

17. Device according to claim 2, wherein said filter layer is divided over its surface into different parts which absorb radiation of differing wavelengths in order to selectively detect differing incident radiation energy.

18. Device according to claim 3, wherein said filter layer is divided over its surface into different parts which absorb radiation of differing wavelengths in order to selectively detect differing incident radiation energy.

19. Device according to claim 4, wherein said filter layer is divided over its surface into different parts which absorb radiation of differing wavelengths in order to selectively detect differing incident radiation energy.

20. Device according to claim 5, wherein said filter layer is divided over its surface into different parts which absorb radiation of differing wavelengths in order to selectively detect differing incident radiation energy.

21. Device according to claim 7, wherein said filter layer is a lead filter and said different parts are each of different thicknesses.

22. Device according to claim 18, wherein said filter layer is a lead filter and said different parts are each of different thicknesses.

23. Device according to claim 19, wherein said filter layer is a lead filter and said different parts are each of different thicknesses.

24. Device according to claim 20, wherein said filter layer is a lead filter and said different parts are each of different thicknesses.

25. A device for recording and storing incident radiation energy from outside of the device and for reading said energy comprising, in order from the outside of the device where the incident radiation comes in:

an outermost layer covering said device at a largest side of the device, said outermost layer being a filter layer which absorbs energy which is not to be detected during exposure of the device;

a transparent layer;

a storage phosphor layer comprising a stimulable phosphor which absorbs and stores said energy and is stimulable by a wavelength $\lambda_a$, a transparent electrode layer, an electroluminescent layer comprising an electroluminescent phosphor emitting, upon application of an electrical field, stimulation light with said wavelength $\lambda_a$, an isolating layer, a conductive layer, a carrier support layer, and at surrounding edges of each layer, a surrounding layer, which is an optical filter layer transmitting exclusively energy released by said storage phosphor layer upon stimulation of the stimulable phosphor, wherein said device includes means to apply an electrical field on said electroluminescent phosphor, and wherein said stimulable phosphor and said electroluminescent phosphor are positioned relative to each other so that said light emitted by said electroluminescent phosphor reaches said stimulable phosphor to stimulate said phosphor to release stimulated light as a detectable signal.

26. Device according to claim 25, wherein said isolating layer contains pigments selected from the group consisting of barium titanate, magnesium oxide and barium silicate.

* * * * *

UNITED STATES PATENT AND TRADEMARK OFFICE
CERTIFICATE OF CORRECTION

PATENT NO. : 6,642,650 B1
DATED : November 4, 2003
INVENTOR(S) : Luc Struye et al.

It is certified that error appears in the above-identified patent and that said Letters Patent is hereby corrected as shown below:

Title page, Item [54] and Column 1, line 1,
Title, "REFUSABLE" should read -- REUSABLE --.

Column 1,
Lines 36-37, "Ganzk örperdosimetersonden" should read -- Ganzkörperdosimetersonden --.

Column 5,
Line 12, "* energy." should read -- energy. --.

Column 6,
Line 33, "1.6;luminescent" should read -- 1.6; luminescent --.

Column 11,
Line 47, "$Ba_{q-x}Sr_xF_{2-a-b}X_b:zA$," should read -- $Ba_{1-x}Sr_xF_{2-a-b}X_b:zA$, --.
Line 50, "$0.70 \leq a \leq 0.96;b$" should read -- $0.70 \leq a \leq 0.96; b$ --.
Line 51, "$10^{-7} \leq z \leq 0.15$," should read -- $10^{-7} < z \leq 0.15$, --.

Column 12,
Line 60, "with-" should read -- with --.

Column 12,
Line 64, "$0 \leq x \geq 5\ 1$," should read -- $0 \leq x \leq 1$, --.

Column 13,
Line 4, "α-Zirconiumphos-phate" should read -- α-Zirconiumphosphate --.

UNITED STATES PATENT AND TRADEMARK OFFICE
CERTIFICATE OF CORRECTION

PATENT NO. : 6,642,650 B1
DATED : November 4, 2003
INVENTOR(S) : Luc Struye et al.

It is certified that error appears in the above-identified patent and that said Letters Patent is hereby corrected as shown below:

Column 13 (cont'd),
Line 6, "768.Further" should read -- 768. Further --.

Signed and Sealed this

Twenty-seventh Day of April, 2004

JON W. DUDAS
*Acting Director of the United States Patent and Trademark Office*